United States Patent
Schneider et al.

(10) Patent No.: US 10,261,159 B2
(45) Date of Patent: Apr. 16, 2019

(54) METHOD AND MAGNETIC RESONANCE APPARATUS FOR FORMING RF PULSES FOR THE COMPENSATION OF INHOMOGENEITIES IN THE EDGE REGION OF THE MAGNETIC RESONANCE SCANNER

(71) Applicant: Siemens Healthcare GmbH, Erlangen (DE)

(72) Inventors: Rainer Schneider, Erlangen (DE); Mario Zeller, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 109 days.

(21) Appl. No.: 15/582,169

(22) Filed: Apr. 28, 2017

(65) Prior Publication Data

US 2017/0315204 A1    Nov. 2, 2017

(30) Foreign Application Priority Data

Apr. 29, 2016    (DE) .......................... 10 2016 207 368

(51) Int. Cl.
*G01R 33/483* (2006.01)
*G01R 33/561* (2006.01)
*G01R 33/565* (2006.01)

(52) U.S. Cl.
CPC ..... *G01R 33/5659* (2013.01); *G01R 33/4833* (2013.01); *G01R 33/5617* (2013.01); *G01R 33/56563* (2013.01)

(58) Field of Classification Search
CPC ............ G01R 33/5659; G01R 33/4833; G01R 33/5617; G01R 33/56563
See application file for complete search history.

(56) References Cited

U.S. PATENT DOCUMENTS

| 6,486,668 B1 | 11/2002 | Ma | |
|---|---|---|---|
| 2015/0241539 A1* | 8/2015 | Kaneko | A61B 5/055 324/307 |
| 2015/0323635 A1 | 11/2015 | Haacke et al. | |
| 2016/0238674 A1* | 8/2016 | Komasaki | G01R 33/093 |
| 2016/0282144 A1* | 9/2016 | Komasaki | H01F 7/0273 |
| 2018/0224513 A1* | 8/2018 | Zeller | G01R 33/5611 |
| 2018/0246182 A1* | 8/2018 | Carinci | G01R 33/5611 |

OTHER PUBLICATIONS

Setsompop et al., "Magnitude Least Squares Optimization for Parallel Radio Frequency Excitation Design Demonstrated at 7 Tesla With Eight Channels," Magnetic Resonance in Medicine, vol. 59, pp. 908-915 (2008).

* cited by examiner

*Primary Examiner* — Rodney A Bonnette
(74) *Attorney, Agent, or Firm* — Schiff Hardin LLP

(57) ABSTRACT

In a method and magnetic resonance (MR) apparatus for recording MR signals in a recording volume of an examination object with an imaging sequence, the recording volume has a first recording region in which at least one system component of the scanner of the MR apparatus has a first homogeneity, which is greater than a homogeneity of the at least one scanner component in a second recording region of the recording volume. A magnetization of nuclear spins in the recording volume is produced by at least one RF pulse, with the RF pulse being determined such that the magnetization produced in the first recording region by the at least one RF pulse is greater than magnetization produced in the second recording region by the at least one RF pulse.

18 Claims, 3 Drawing Sheets

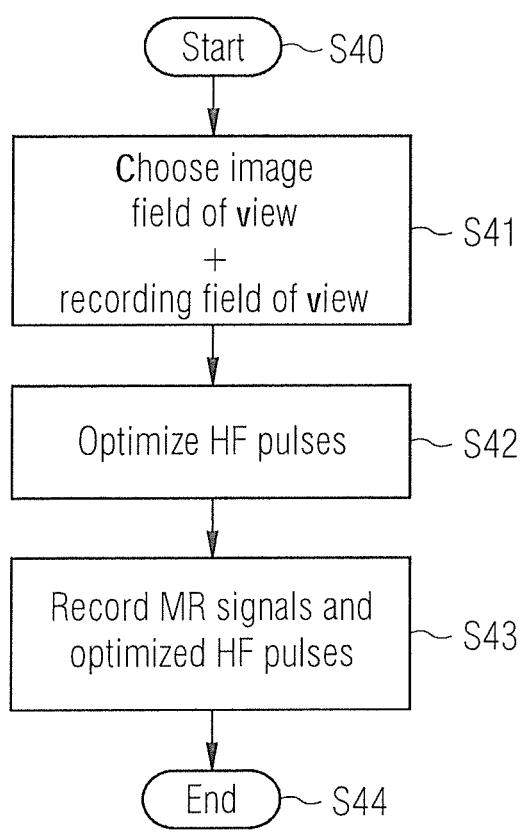

METHOD AND MAGNETIC RESONANCE APPARATUS FOR FORMING RF PULSES FOR THE COMPENSATION OF INHOMOGENEITIES IN THE EDGE REGION OF THE MAGNETIC RESONANCE SCANNER

BACKGROUND OF THE INVENTION

Field of the Invention

The present invention concerns a method for recording magnetic resonance (MR) signals in an MR apparatus, and to an MR apparatus and a non-transitory, computer-readable data storage medium that implements such a method.

Description of the Prior Art

The MR data acquisition scanner is the basic structure of an MR apparatus that receives a patient in order to obtain MR data from the patient. MR scanners of the "closed" type have a patient-receiving tunnel or bore therein, which proceeds through the scanner and is surrounded by other components, such as the basic field magnetic, gradient coils, and radio-frequency (RF) antennas.

MR scanners with a relatively short patient receiving tunnel have a reduced homogeneity of the basic magnetic field B0 and a reduced gradient accuracy at the edges of the field of view in the longest direction of the patient receiving tunnel, which is conventionally called the z-axis. For coronary and sagittal recordings, this leads to compressed regions in the reconstructed images with high signal intensity in the regions at the edge of the patient receiving tunnel since a number of regions of an examination object are mapped on one image point as a result of the inhomogeneity of the gradient field and/or of the polarization field B0, so the signal intensity increases in this image point. This means that due to the incorrect spatial encoding, image points having increased signal intensity exist. In particular in the case of imaging sequences that use a parallel imaging technique, such as GRAPPA, artifacts often occur, such as at the position of the field of view in the z-direction, also called Field of View (FOVz/R), where R is the acceleration factor. In the case of parallel imaging, the missing raw data regions that have not been scanned are calculated by reference scans or calibration scans. A good reference or calibration data record is required for this purpose, however. If this data record is incorrect, then the MR images calculated using parallel imaging are also incorrect. The artifacts in the case of parallel imaging are also due to the fact that the imaging algorithms are not conventionally capable of dealing with locally restricted regions having very high signal intensity, which, as described above, can occur at the edges of the MR system components. Particularly in the case of parallel imaging, this leads to incomplete suppression of image defects known as aliasing artifacts in these regions.

This phenomenon is particularly prominent with spin-echo sequences, since there the dephasing due to B0 inhomogeneities or gradient inhomogeneities plays a less significant role and does not lead to signal loss as in the case of gradient echo sequences.

One possibility of reducing these artifacts is to average the MR signals, by the MR signals being recorded multiple times, for example twice, i.e. once with recording of straight k-space lines and once with recording of the k-space lines that are not straight. The central k-space lines of the two recordings are then combined and used to calculate the reference or calibration data records. A method of this kind eliminates the artifacts in the final compiled image, but the scanning time is at least doubled, and this is a significant drawback.

SUMMARY OF THE INVENTION

An object of the present invention is to reduce the drawbacks mentioned above and in particular to reduce artifacts that occur at an edge region of system components of the MR system, such as at the edge of the polarization field and/or at the edge of the gradient field.

According to a first aspect of the invention, in a method for recording MR signals in an MR apparatus, a control computer operates an MR data acquisition scanner of the MR apparatus so as to execute an imaging sequence in order to acquire MR signals from a recording volume of an examination object in the scanner. The recording volume has a first recording region in which at least one scanner component of the MR scanner of the MR apparatus has a first homogeneity. The recording volume has a second recording region, wherein the homogeneity in the first recording region is greater than the homogeneity in the same scanner component in the second recording region. Magnetization of nuclear spins in the recording volume is excited with at least one RF pulse radiated by an RF radiator of the scanner. The RF pulse is determined in the control computer so as to cause the magnetization produced in the first recording region by the at least one RF pulse to be greater than the magnetization produced in the second recording region by the at least one RF pulse. The acquired MR data are made available in electronic form from the control computer, as a data file.

The lower homogeneity of the scanner component and of the polarization field or of the magnetic field gradient leads to amplified incorrect spatial encoding of the image points in the second recording region, so high signal intensities would result if a number of image points were encoded at the same location. This effect is inventively compensated to be the magnetization in the second recording region with the greater inhomogeneity is made to be lower. The excitation of the magnetization is controlled such that the magnetization in the first recording region is greater than in the second recording region. The lower magnetization produces lower signal intensities, so the high signal intensities in the edge region of the MR system are reduced.

The MR signals for creating at least one MR image of the examination object are preferably recorded in an image field of view and in a recording field of view. The MR image to be generated with the imaging sequence is limited to the image field of view here, wherein the recording field of view is greater than the image field of view in order to reduce effects of MR signals from outside of the image field of view to the image field of view. The image field of view can essentially be limited to the first recording region here, and the recording field of view can comprise the second recording region. In the first recording region with the lower inhomogeneity the signals are recorded which are to be displayed in order to create the MR image. MR signals are also recorded from the second recording region, however, to reduce the effect of the MR signals from outside, for example due to convolution (foldover) artifacts.

A phase encoding direction is preferably chosen in case of the imaging sequence in the examination object such that the second recording region with the greater inhomogeneity is farther away from an isocenter of a magnet of the MR system than the first recording region, with the second recording region adjoining the first recording region in the phase encoding direction.

The convolutions of regions outside of the image field of view primarily occur in the phase encoding direction. If the second recording region is located farther out in the phase encoding direction, the inhomogeneities in the phase encoding direction in the second recording region occur outside of the first recording region.

The at least one RF pulse can be determined such that the magnetization excited in the first recording region by the at least one RF pulse is essentially constant while the magnetization in the second recording region decreases from the isocenter of the magnet in the direction of an edge region of the magnet. The result of this is that regions in which the inhomogeneities are greater, and so the incorrect encodings occur more frequently, have a lower signal intensity so the light artifacts are reduced.

The magnetization can decrease, for example, in a section of the recording field of view, which does not include the image field of view, in the phase encoding direction from the isocenter of the MR system in the direction of the edge region of the magnet.

The imaging sequence is preferably a spin-echo-based imaging sequence in which the MR signals are based on spin echoes. With this type of signal generation the light signal artifact mentioned in the introduction is particularly prominent in the outer image region. The invention is not limited to spin echo signals; however, it can also be used with other imaging sequences.

Furthermore, the imaging sequence can use a parallel recording technique in which the MR signal is received with a number of RF receiving channels, wherein the raw data space pertaining to the imaging sequence is not completely filled with recorded MR signals and a section of the raw data space is reconstructed using the recorded MR signals. With this parallel imaging technique, the light artifact occurs at the outer edge in an augmented manner. With parallel recording techniques the artifact can be replicated by additional convolutions in the image field of view. These additional artifacts can therefore likewise be reduced by the proposed methods with the parallel imaging technique.

With a parallel transmission technique having a number of RF transmission channels it is easily possible to model the at least one RF pulse in such a way that a first magnetization, a preferably constant magnetization, is achieved in the first recording region while the magnetization decreases or is lower in the second recording region.

The RF pulse can be determined here such that the following equation is minimized:

$$\hat{b} = \underset{b}{\arg\min}\{\|\|Ab - m_{des}\|\|_w^2 + R(b)\}, \quad (1)$$

where A is a system matrix of the MR system that represents at least physical properties of at least one transmitting device with which the at least one RF pulse is radiated, $m_{des}$ describes the target magnetization in the first and second recording region, b describes the pulse forms and R(b) is a regularization term which takes into account a maximum RF energy of the at least one RF pulse. The magnetization $m_{des}$ to be calculated can be calculated here in the recording field of view and the image field of view, with the magnetization in the recording field of view outside of the image field of view being chosen such that it is lower than in the image field of view, for example decreases from the edge of the image field of view to the outer edge of the recording field of view.

It is also possible for the RF pulse to be determined such that the magnetization in the second recording region is essentially suppressed, so artifacts due to incorrect encodings in the same image point are reduced further. It is likewise possible to choose the at least one RF pulse as a function of the size of the first recording region relative to the size of the second recording region.

The invention also relates to an MR apparatus which, as stated above, has an image sequence controller and an MR data acquisition scanner that is operated by the image sequence controller in the manner as described above, in order to reduce the magnetization in the second recording region.

The invention also encompasses a non-transitory, computer-readable data storage medium that is encoded with programming instructions. When the storage medium is loaded into a control computer system, possibly in a distributed manner, of an MR apparatus, the programming instructions cause the method as described above to be implemented, when the programming instructions are executed by the control computer system.

BRIEF DESCRIPTION OF THE DRAWINGS

FIG. 4 is a flowchart with basic steps for preventing the artifacts in the recording of MR signals in the situation in FIG. 3.

DESCRIPTION OF THE PREFERRED EMBODIMENTS

Figure 1:
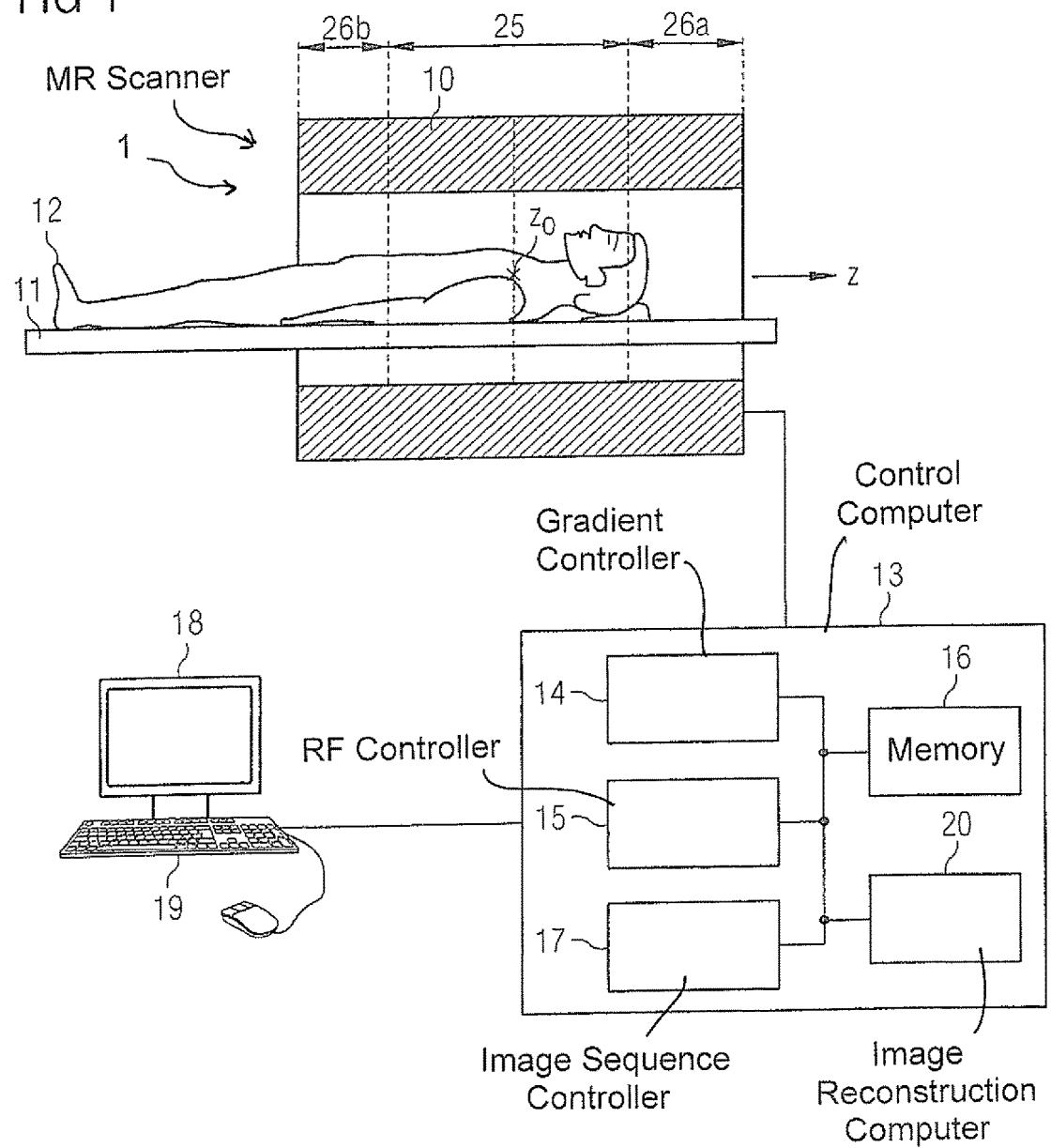
FIG. 1 schematically illustrates an MR system with which artifacts in an edge region of an MR system can be inventively reduced.

FIG. 1 schematically shows an MR apparatus with which artifacts in an edge region of the MR scanner 1 of the MR apparatus, which are produced by encoding of different tissue in a single pixel, can be inventively reduced. The magnetic resonance scanner 1 has a magnet 10 for generating a polarization field B0, wherein a patient on a couch 11 represents the examination object 12, who is moved into the isocenter of the magnet 10 in order to record spatially encoded magnetic resonance signals from an examination region. As will be described below in detail, the examination region has a first recording region 25 with a higher homogeneity of MR scanner components and a second recording region 26a, 26b in which the homogeneity of the same MR scanner components is lower. The homogeneity of the polarization field B0 and/or the linearity of the magnetic field gradients, which is generated by gradient coils (not shown) for the spatial encoding, can be considered as the MR scanner component. By radiating radio-frequency pulses and switching magnetic field gradients, the magnetization of nuclear spins that is produced by the polarization field B0 can be disrupted by deflecting the nuclear spins from the equilibrium position, and the currents induced in the receiving coils (not shown) as the nuclear spins relax and return to the equilibrium position, are converted into magnetic resonance signals. The general mode of operation for creating MR images by detecting the Magnetic resonance signals is known to those skilled in the art, so a detailed description thereof is not necessary herein.

The magnetic resonance apparatus also has a central MR control computer 13, which is used for controlling the overall MR apparatus. The central MR control computer 13 has a gradient controller 14 for controlling and switching the magnetic field gradients and an RF controller 15 for generating and controlling the RF pulses for deflecting the nuclear spins from the equilibrium position. The RF controller 15 is preferably a multi-channel controller, which generates RF pulses in a number of independent channels. The imaging sequences required for recording the MR images can be stored in a memory 16, as well as all other program modules necessary for operation of the MR apparatus. An image sequence controller 17 controls the image recording and, dependent on the chosen imaging sequence, the sequence of the magnetic field gradients and the RF pulses and the receiving intervals of the MR signals. The image sequence controller also controls the gradient controller 14 and the RF controller 15. In an image reconstruction computer 20, MR images can be calculated which can be displayed on a display 18. An operator can control the MR apparatus via an input unit 19. The RF unit 15 then calculates the RF pulses such that a reduction in the magnetization of the regions 26a, 26b is achieved relative to the region 25, as will be described in more detail below.

Figure 2:
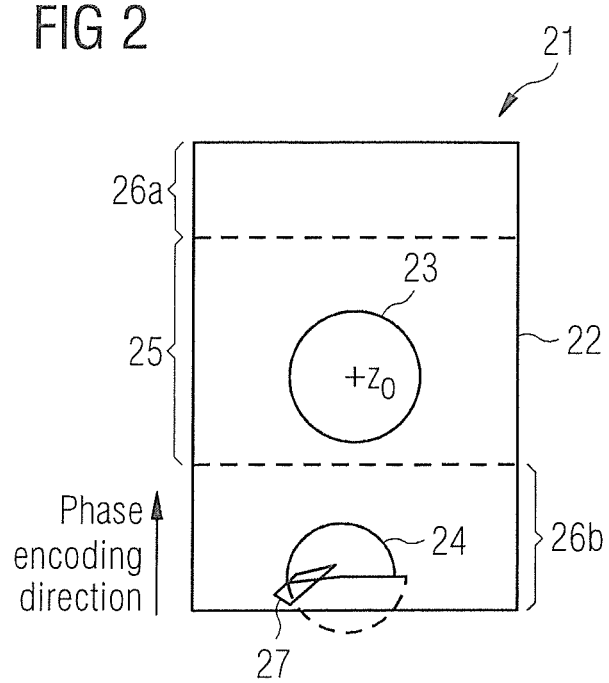
FIG. 2 shows an example of an MR image in which an artifact, which is to be prevented with the system in FIG. 1, occurs in an edge region.

FIG. 2 schematically illustrates an MR image 22 that shows a first examination object 23 and a second examination object 24. The examination object 24 is positioned at the edge of the MR scanner in the phase encoding direction, i.e. at the edge at which the homogeneity of the polarization field B0 is lower, and at which the linearity of the magnetic field gradient for generating the linear magnetic field gradients is lower than in a region in which the object 23 is situated. In the embodiment shown in FIG. 2, it is assumed that the first examination object is located essentially centrally in an isocenter $Z_0$ of the polarization field magnet. In a first recording region around the isocenter, which is shown in FIG. 2 as recording region 25, there is a first homogeneity of the polarization field B0 and the magnetic field gradients during image recording. Even after adjustment of all scanner components to the examination object, which is known as shimming, there is a second recording region, namely the sections 26a and 26b, in which the magnetic field homogeneity and the gradient linearity are lower than in the first recording region 25. With reference to FIG. 1, the first recording region 25 around the isocenter is shown in cross-section with the second recording region 26a and 26b in the regions in the vicinity of the edge. This second recording region is defined, for example, by the spatial distribution in the MR scanner of the Larmor frequency of the spins having a value that differs there by more than 10% from the desired value (linear relationship with gradient, constant relationship in the case of basic field without gradient). The increased inhomogeneity in region 26b leads to an incorrect spatial designation of tissue in the individual image points for the examination object 24, with the phase encoding direction being as indicated by the arrow. An artifact 27 with a lower signal intensity results due to the fact that a number of image points are placed (designated as being) at a single location in the MR image. Artifacts 27 of this kind can be reduced or prevented when the magnetization in an examination object is chosen as in conjunction with FIG. 3.

Figure 3:
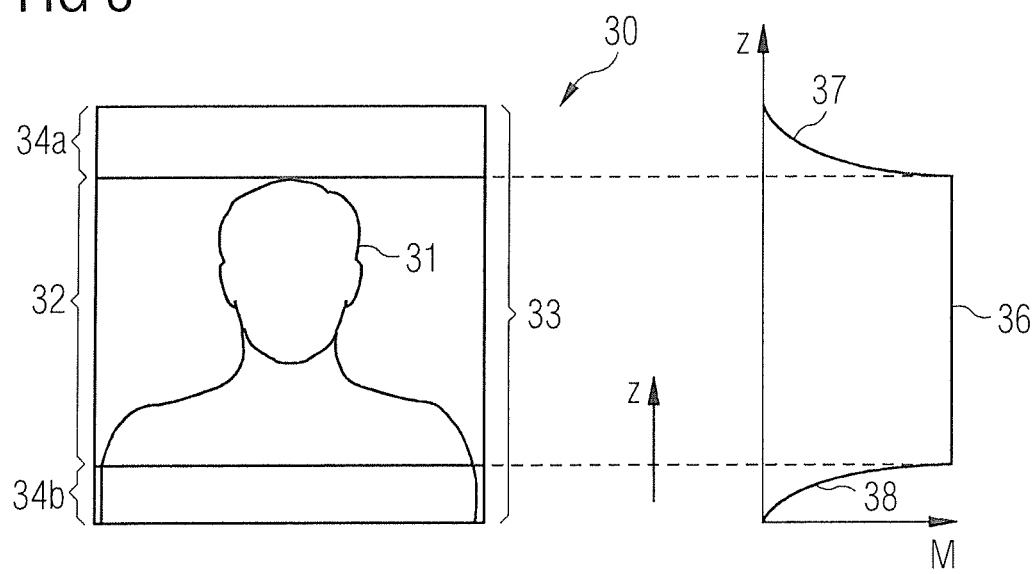
FIG. 3 schematically shows an examination object with a recording field of view and an image field of view and the calculated magnetization for preventing the artifacts in FIG. 2.

FIG. 3 shows, as an example, an MR image 30 of an examination person 31, wherein an MR image of an image field of view 32 is to be generated. This means that the MR image to be generated represents the image field of view 32. Overall, however, MR signals are recorded from a recording field of view 33, wherein the recording field of view still has outer regions 34a and 34b in the phase encoding direction, and these are similar to the regions 26a and 26b in FIGS. 1 and 2. In these regions of the recording field of view outside of the image field of view, the inhomogeneity is greater than in the image field of view 32. The phase encoding direction in the imaging sequence that is used, for example a spin echo imaging sequence with parallel imaging, runs in the z-direction along the body axis of the examination person. To reduce artifacts like the artifact 27 in FIG. 2, the RF pulses radiated with a multi-channel RF unit can be chosen in such a way that a magnetization is produced in the examination person, as can be seen in the right part of FIG. 3. The magnetization can have a constant plateau 36 here over the image field of view 32, whereas the magnetization decreases to zero in the recording field of view outside of the image field of view, as is shown by the regions 37 and 38 in the magnetization curve. The effect of various tissue fractions being encoded on a single pixel or a single image point and leading to an increased signal intensity is reduced by the decreased magnetization in regions 34a and 34b. The decreased magnetization also results in a reduced signal intensity with this kind of incorrect encoding. Artifacts having a very high signal intensity at the edge are consequently reduced or prevented.

An inverse problem can be solved using the following equation for determining the different RF pulses:

$$\hat{b} = \arg\min_{b}\{\|Ab - m_{des}\|_w^2 + R(b)\}$$

Here, A denotes the matrix of the physical properties of the experiment, i.e. the B1 sensitivity profiles of the different transmission coils, a B0 field map and the raw data trajectory in the transmission space of the RF pulses to be optimized. The optimization vector b denotes either the optimized RF pulses (dynamic pulses) or the optimized RF shim weights of the RF pulses that enable a minimum separation from the magnetization profile $m_{des}$. An optional regularization term R(b) can be used to stay within the SAR limits (specific absorption rates) or the limits of the RF hardware. The target magnetization can be chosen as desired and as shown, for example, in FIG. 3. The image field of view should be distinguished here from the recording field of view during calculation. The image field of view is the field of view from which, finally, the conclusive MR image is to be generated, and the recording field of view contains the image field of view and the adjoining regions to prevent effects from the adjoining regions in the image field of view. The magnetization is calculated in the recording field of view since the magnetization is significant, particularly in the regions outside of the image field of view.

Shimming of the RF pulses and the dynamic RF pulses can be chosen in such a way that the signal in the regions outside of the image field of view, i.e. in the regions 34a and 34b in FIG. 3, is completely suppressed. If it is not possible to obtain values in the regions 34a and 34b for calculation of the matrix A for the B0-field map or the B1 linearity owing to inadequate receiving coil sensitivity or the inadequate signal-to-noise ratio, the existing field maps can be extrapolated for the B1 and B0 fields in order to also cover regions 34a and 34b.

When calculating the target magnetization it can be necessary to strike a compromise between the desired constant magnetization in the image field of view and the reduction in the magnetization in the regions outside of the image field of view.

The calculated RF pulse profiles for the multi-channel irradiation of the RF pulses can be used with a spin echo sequence for excitation and the refocusing pulses can be used for subsequent echo generation. Different pulse profiles can be used for excitation and for refocusing pulses, for example to achieve a reduced excitation, but complete refocusing.

The pulse profiles can also depend on the parameters of the field of view or the spatial position of the field of view. For example, it can be desirable to have a steep transition between region 36 and region 37 or 38 with an excitation angle of 0° in regions 37 and 38 where the image field of view is large compared to the regions of the recording field of view outside of the image field of view. Furthermore, the magnetization profiles in regions 37 and 38, i.e. in the regions outside of the image field of view, are not symmetrical, for example a strong attenuation of the magnetization can be desirable in the direction of the abdomen, i.e. in region 34b, wherein a lower attenuation can be desirable in the direction of the head, i.e. in the direction of region 34a.

The steps with which optimized MR-RF pulses are calculated for minimization of artifacts in the edge regions of the MR images are summarized in FIG. 4.

The method starts in a step S41 and the image field of view and the recording field of view are chosen in step S42, as is illustrated for example in FIG. 3. Furthermore, the MR system can be adjusted to the examination object in a step that is not shown, with an adjustment of the RF channels and of the polarization field B0. In step S42 the RF pulses are optimized, for example using the above equation (1), to select the magnetization in such a way that artifacts such as artifact 27 in FIG. 2 are reduced or suppressed. In step S43 the MR signals can then be recorded using the optimized RF pulses, wherein an MR image can then be calculated (not shown), with the artifacts having light signal intensity at the edge in this MR image, or the convolutions of these artifacts in the image field of view then being avoided. The method ends in step S44.

In summary, aliasing artifacts are suppressed in accordance with the invention without increasing the scanning time overall.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for acquiring magnetic resonance (MR) signals from a recording volume of an examination subject, comprising:

using a control computer to operate an MR data acquisition scanner to execute an imaging sequence in order to acquire MR signals from a recording volume of an examination object situated in the scanner, said recording volume comprising a first recording region in which at least one scanner component of the data acquisition scanner produces a first homogeneity, and a second recording region in which said at least one scanner component produces a second homogeneity, said first homogeneity being higher than said second homogeneity;

said MR data acquisition scanner comprising a radio-frequency (RF) radiator and, with said control computer, operating said MR data acquisition scanner in said imaging sequence to excite a magnetization of nuclear spins in said recording volume by radiating at least one RF pulse from said RF radiator;

in said control computer, configuring said at least one RF pulse in order to cause said RF pulse to produce a larger magnetization of said nuclear spins in said first recording region than said at least one RF pulse produces in said second recording region; and making the MR signals acquired from the examination object by execution of said imaging sequence available from said control computer in electronic form, as a data file.

2. A method as claimed in claim 1 comprising, with said control computer, executing said imaging sequence in order to operate said MR data acquisition scanner to acquire MR signals, representing at least one MR image of the examination object, in an image field of view and in a recording field of view, with said at least one MR image being limited to said image field of view, and wherein said recording field of view is larger than said image field of view in order to reduce effects on said image field of view by MR signals from outside of said image field of view, and wherein said image field of view corresponds to said first recording region and said recording field of view corresponds to said second recording region.

3. A method as claimed in claim 1 wherein said MR data acquisition scanner has an isocenter, and wherein said method comprises, with said control computer, defining a phase encoding direction in said imaging sequence that causes said second recording region to be farther from said isocenter than said first recording region, and with said second recording region adjoining said first recording region in said phase encoding direction.

4. A method as claimed in claim 1 wherein said MR data acquisition scanner has an opening therein in which said examination object is situated while said imaging sequence is executed, said opening having an edge region and said MR data acquisition scanner having an isocenter that is in said opening, and wherein said method comprises, with said control computer, configuring said at least one RF pulse to cause the magnetization of the nuclear spins in said first recording region to be constant, and to cause the magnetization of nuclear spins in the second recording region to decrease from the isocenter to the edge region.

5. A method as claimed in claim 1 wherein said MR data acquisition scanner has an opening therein in which said examination object is situated while said imaging sequence is executed, said opening having an edge region and said MR data acquisition scanner having an isocenter that is in said opening, and wherein said method comprises, with said control computer:

executing said imaging sequence in order to operate said MR data acquisition scanner to acquire MR signals, representing at least one MR image of the examination object, in an image field of view and in a recording field of view, with said at least one MR image being limited to said image field of view, and wherein said recording field of view is larger than said image field of view in order to reduce effects on said image field of view by MR signals from outside of said image field of view, and wherein said image field of view corresponds to said first recording region and said recording field of view corresponds to said second recording region;

defining a phase encoding direction in said imaging sequence that causes said second recording region to be farther from said isocenter than said first recording region, and with said second recording region adjoining said first recording region in said phase encoding direction; and configuring said at least one RF pulse to cause the magnetization of the nuclear spins in said first recording region to be constant, and to cause the magnetization of nuclear spins in the second recording region to decrease in said phase encoding direction from the isocenter to the edge region.

6. A method as claimed in claim 1 comprising, with said control computer, operating said MR data acquisition scanner to execute a spin-echo-based imaging sequence as said imaging sequence, and acquiring said MR signals based on spin echos.

7. A method as claimed in claim 1 wherein said MR data acquisition scanner comprises a plurality of RF reception channels, and comprising:

with said control computer, operating said MR data acquisition scanner to execute said imaging sequence with parallel recording of said MR signals respectively in said plurality of RF reception channels;

entering said MR signals as raw data into a memory organized as k-space with a portion of k-space not being completely filled with said raw data; and in said control computer, reconstructing raw data, using the acquired MR signals, for said region of k-space that was not completely filled with said MR signals.

8. A method as claimed in claim 1, comprising configuring the at least one RF pulse so as to minimize $$\hat{b} = \underset{b}{\operatorname{argmin}}\{\|Ab - m_{des}\|_w^2 + R(b)\},$$

wherein A is a system matrix of the MR data acquisition scanner, comprising at least physical properties of said RF radiator, $m_{des}$ is a target magnetization in the first and second recording regions, b contains the RF pulse forms and R(b) is a regularization term that takes into account a maximum RF energy of the at least one RF pulse.

9. A method as claimed in claim 1 comprising configuring said at least one RF pulse to cause the magnetization of the nuclear spins in the second recording region to be suppressed.

10. A method as claimed in claim 1 comprising configuring said at least one RF pulse as a function of a variable of said first recording region relative to said second recording region.

11. A magnetic resonance (MR) apparatus comprising:
an MR data acquisition scanner;
a control computer configured to operate said MR data acquisition scanner to execute an imaging sequence in order to acquire MR signals from a recording volume of an examination object situated in the scanner, said recording volume comprising a first recording region in which at least one scanner component of the data acquisition scanner produces a first homogeneity, and a second recording region in which said at least one scanner component produces a second homogeneity, said first homogeneity being higher than said second homogeneity;

said MR data acquisition scanner comprising a radio-frequency (RF) radiator, and said control computer being configured to operate said MR data acquisition scanner in said imaging sequence to excite a magnetization of nuclear spins in said recording volume by radiating at least one RF pulse from said RF radiator;

said control computer being configured to configure said at least one RF pulse in order to cause said RF pulse to produce a larger magnetization of said nuclear spins in said first recording region than said at least one RF pulse produces in said second recording region; and said control computer being configured to make the MR signals acquired from the examination object by execution of said imaging sequence available from said control computer in electronic form, as a data file.

12. An MR apparatus as claimed in claim 11 wherein said control computer is configured to operate said MR data acquisition scanner to acquire MR signals, representing at least one MR image of the examination object, in an image field of view and in a recording field of view, with said at least one MR image being limited to said image field of view, and wherein said recording field of view is larger than said image field of view in order to reduce effects on said image field of view by MR signals from outside of said image field of view, and wherein said image field of view corresponds to said first recording region and said recording field of view corresponds to said second recording region.

13. An MR apparatus as claimed in claim 11 wherein said MR data acquisition scanner has an isocenter, and wherein said control computer is configured to define a phase encoding direction in said imaging sequence that causes said second recording region to be farther from said isocenter than said first recording region, and with said second recording region adjoining said first recording region in said phase encoding direction.

14. An MR apparatus as claimed in claim 11 wherein said MR data acquisition scanner has an opening therein in which said examination object is situated while said imaging sequence is executed, said opening having an edge region and said MR data acquisition scanner having an isocenter that is in said opening, and wherein said control computer is configured to configure said at least one RF pulse to cause the magnetization of the nuclear spins in said first recording region to be constant, and to cause the magnetization of nuclear spins in the second recording region to decrease from the isocenter to the edge region.

15. An apparatus as claimed in claim 11 comprising:
said MR data acquisition scanner having an opening therein in which said examination object is situated while said imaging sequence is executed, said opening having an edge region and said MR data acquisition scanner having an isocenter that is in said opening;

said control computer being configured to execute said imaging sequence in order to operate said MR data acquisition scanner to acquire MR signals, representing at least one MR image of the examination object, in an image field of view and in a recording field of view, with said at least one MR image being limited to said image field of view, and wherein said recording field of view is larger than said image field of view in order to reduce effects on said image field of view by MR signals from outside of said image field of view, and wherein said image field of view corresponds to said first recording region and said recording field of view corresponds to said second recording region;

said control computer being configured to define a phase encoding direction in said imaging sequence that causes said second recording region to be farther from said isocenter than said first recording region, and with said second recording region adjoining said first recording region in said phase encoding direction; and said control computer being configured to configure said at least one RF pulse to cause the magnetization of the nuclear spins in said first recording region to be constant, and to cause the magnetization of nuclear spins in the second recording region to decrease in said phase encoding direction from the isocenter to the edge region.

16. An MR apparatus as claimed in claim 11 wherein said MR data acquisition scanner comprises a plurality of RF reception channels, and wherein said control computer is configured to:

operate said MR data acquisition scanner to execute said imaging sequence with parallel recording of said MR signals respectively in said plurality of RF reception channels;

enter said MR signals as raw data into a memory organized as k-space with a portion of k-space not being completely filled with said raw data; and reconstruct raw data, using the acquired MR signals, for said region of k-space that was not completely filled with said MR signals.

17. An MR apparatus as claimed in claim 11, wherein said control computer is configured to configure the at least one RF pulse so as to minimize $$\hat{b} = \arg\min_{b}\{\|Ab - m_{des}\|_w^2 + R(b)\},$$

wherein A is a system matrix of the MR data acquisition scanner, comprising at least physical properties of said RF radiator, $m_{des}$ is a target magnetization in the first and second recording regions, b contains the RF pulse forms and R(b) is a regularization term that takes into account a maximum RF energy of the at least one RF pulse.

18. A non-transitory, computer-readable data storage medium encoded with programming instructions, said storage medium being loaded into a control computer of a magnetic resonance (MR) apparatus that comprises an MR data acquisition scanner that has a radio-frequency (RF) radiator, said programming instructions causing said control computer to:

operate said MR data acquisition scanner to execute an imaging sequence in order to acquire MR signals from a recording volume of an examination object situated in the scanner, said recording volume comprising a first recording region in which at least one scanner component of the data acquisition scanner produces a first homogeneity, and a second recording region in which said at least one scanner component produces a second homogeneity, said first homogeneity being higher than said second homogeneity;

operate said MR data acquisition scanner in said imaging sequence to excite a magnetization of nuclear spins in said recording volume by radiating at least one RF pulse from said RF radiator;

configure said at least one RF pulse in order to cause said RF pulse to produce a larger magnetization of said nuclear spins in said first recording region than said at least one RF pulse produces in said second recording region; and make the MR signals acquired from the examination object by execution of said imaging sequence available from said control computer in electronic form, as a data file.

* * * * *